(12) United States Patent
Zhang et al.

(10) Patent No.: US 11,569,214 B2
(45) Date of Patent: Jan. 31, 2023

(54) DISPLAY APPARATUS WITH IMAGE ACQUISITION REGION, MANUFACTURING METHOD AND OPERATING METHOD THEREOF

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Qing Zhang, Beijing (CN); Baoqing Yin, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 667 days.

(21) Appl. No.: 16/489,688

(22) PCT Filed: Dec. 28, 2018

(86) PCT No.: PCT/CN2018/124827
§ 371 (c)(1),
(2) Date: Aug. 28, 2019

(87) PCT Pub. No.: WO2020/042506
PCT Pub. Date: Mar. 5, 2020

(65) Prior Publication Data
US 2021/0335769 A1    Oct. 28, 2021

(30) Foreign Application Priority Data
Aug. 30, 2018  (CN) .......................... 201811005800.7

(51) Int. Cl.
*H01L 25/18* (2006.01)
*H01L 25/00* (2006.01)
(Continued)

(52) U.S. Cl.
CPC .............. *H01L 25/18* (2013.01); *H01L 25/50* (2013.01); *H01L 51/5209* (2013.01);
(Continued)

(58) Field of Classification Search
CPC ..... H01L 25/18; H01L 25/50; H01L 51/5209; H01L 51/5225; H01L 27/3244;
(Continued)

(56) References Cited

U.S. PATENT DOCUMENTS

2004/0031965 A1* 2/2004 Forrest .................. H01L 27/288
  257/79
2018/0341353 A1* 11/2018 Zhang .................... G06F 3/0446
2020/0066816 A1* 2/2020 Zhao .................... H01L 27/3234

FOREIGN PATENT DOCUMENTS

CN        108461533 A  *  8/2018 ........... G06K 9/0004
CN        108461533 A     8/2018

OTHER PUBLICATIONS

CN First Office Action in Application No. 201811005800.7, dated Sep. 2, 2020.

* cited by examiner

*Primary Examiner* — Antoinette T Spinks
(74) *Attorney, Agent, or Firm* — Syncoda LLC; Feng Ma

(57) ABSTRACT

A display apparatus includes a display panel having an image acquisition region within a display area, and an image acquisition device over a side of the display panel opposing to its display surface. The image acquisition device is at a position corresponding to the image acquisition region, and is configured to capture an image based on lights from an
(Continued)

outside pattern over a side of the display panel proximal to the display surface. The display panel includes a substrate and a plurality of light-emitting elements over the substrate. The plurality of light-emitting elements comprises one or more first light-emitting elements positionally within the image acquisition region. At least one first light-emitting element includes a non-transparent electrode provided with at least one through-hole configured to allow the lights from the outside pattern to pass through the display panel.

18 Claims, 3 Drawing Sheets

(51) Int. Cl.
*H01L 51/52* (2006.01)
*H04N 5/225* (2006.01)
*H04N 5/232* (2006.01)
*H05K 1/18* (2006.01)
*H01L 27/32* (2006.01)

(52) U.S. Cl.
CPC ....... *H01L 51/5225* (2013.01); *H04N 5/2251* (2013.01); *H04N 5/2257* (2013.01); *H04N 5/23229* (2013.01); *H05K 1/189* (2013.01); *H01L 27/3244* (2013.01); *H01L 2251/5307* (2013.01); *H01L 2251/5315* (2013.01); *H05K 2201/10128* (2013.01); *H05K 2201/10151* (2013.01)

(58) Field of Classification Search
CPC ..... H01L 2251/5307; H01L 2251/5315; H01L 27/3234; H01L 51/5221; H04N 5/2251; H04N 5/2257; H04N 5/23229; H05K 1/189; H05K 2201/10128; H05K 2201/10151
See application file for complete search history.

DISPLAY APPARATUS WITH IMAGE ACQUISITION REGION, MANUFACTURING METHOD AND OPERATING METHOD THEREOF

CROSS-REFERENCE TO RELATED APPLICATION

The present application claims priority to Chinese Patent Application No. CN 201811005800.7 filed on Aug. 30, 2018, the disclosure of which is hereby incorporated by reference in its entirety.

TECHNICAL FIELD

The present disclosure relates generally to the field of display technologies, and more specifically to a display apparatus, its manufacturing method, and its operating method.

BACKGROUND

With the rapid development of technologies, the use and application of electronic products with display functionality, such as display apparatuses, has become more and more extensive, and there have also been an increasingly high demand for the display effects for these electronic products.

Currently many display apparatuses are often equipped with camera devices. In order to realize a better display effect for the display apparatus by having a narrow bezel (i.e. border) for the display panel (i.e. display screen), it is usually required to cut a slot or groove within the display panel that positionally corresponds to the camera device, so as to allow external lights to enter into the camera device.

However, the above approach has increased the difficulty in manufacturing the display apparatuses. In addition, the slot/groove region of the display screen cannot display images, which thus limits an effective display area of the display apparatuses.

SUMMARY

In a first aspect, the present disclosure provides a display apparatus.

The display apparatus includes a display panel and an image acquisition device over a side of the display panel opposing to a display surface thereof. The display panel is provided with an image acquisition region within a display area thereof. The image acquisition device is at a position corresponding to the image acquisition region, and is configured to capture an image based on lights from an outside pattern over a side of the display panel proximal to the display surface.

The display panel comprises a substrate and a plurality of light-emitting elements over the substrate, wherein the plurality of light-emitting elements comprises one or more first light-emitting elements positionally within the image acquisition region of the display panel. Each of at least one of the one or more first light-emitting elements comprises a non-transparent electrode, wherein the non-transparent electrode is provided with at least one through-hole therein, configured to allow the lights from the outside pattern to pass through the display panel.

According to some embodiments, the image acquisition device is over a side of the non-transparent electrode opposing to the substrate.

Optionally, each of the one or more first light-emitting elements can further include an organic light-emitting functional layer and a first electrode. The first electrode is substantially transparent, the organic light-emitting functional layer is between the first electrode and the non-transparent electrode, and the first electrode is between the substrate and organic light-emitting functional layer.

Furthermore, each of the one or more first light-emitting elements can further include a thin film transistor over the substrate. It is configured such that one of a drain electrode or a source electrode of the thin film transistor is electrically connected with the first electrode such that the thin film transistor can control a light-emitting state of the each of the one or more first light-emitting elements.

Herein, the thin film transistor can include a gate electrode and an active layer, and the gate electrode is non-light-transmitting and is between the active layer and the organic light-emitting functional layer.

According to some embodiments of the display apparatus, the image acquisition device is over a side of the substrate opposing to the non-transparent electrode.

Optionally, each of the one or more first light-emitting elements can further comprise an organic light-emitting functional layer and a first electrode. The first electrode is substantially transparent, the organic light-emitting functional layer is between the first electrode and the non-transparent electrode, and the non-transparent electrode is between the organic light-emitting functional layer and the substrate.

Furthermore, the non-transparent electrode can be configured to have a reflecting surface facing the organic light-emitting functional layer.

The non-transparent electrode can optionally comprise a first electrode sub-layer and a second electrode sub-layer. The first electrode sub-layer is between the second electrode sub-layer and the substrate, and the second electrode sub-layer has a reflective surface facing the organic light-emitting functional layer.

Herein optionally, the first electrode sub-layer includes an electrode material with a high work function value, and the electrode material can optionally comprise ITO.

According to some embodiments of the display apparatus, a number of the at least one of the one or more first light-emitting elements is more than one, and the non-transparent electrode in each of the at least one of the one or more first light-emitting elements is integrated with one another.

According to some other embodiments of the display apparatus, a number of the at least one of the one or more first light-emitting elements is more than one, and the non-transparent electrode in each of the at least one of the one or more first light-emitting elements is spaced apart from one another.

In the display apparatus disclosed herein, a cross-sectional shape of each of the at least one through-hole can be a circle, a square, a polygon, or an irregular shape.

According to some embodiments, each of the at least one through-hole has a cross-sectional shape of a circle, which has a diameter of approximately 2-10 microns.

Optionally in the display apparatus, the at least one through-hole in each of the at least one of the one or more first light-emitting elements together has a number of more than one, and is configured to have a substantially uniform distribution in an inside-to-outside direction based on a center of the image acquisition region.

In the display apparatus, the image acquisition device can optionally be configured to convert optical signals derived from the lights from the outside pattern into electrical signals, and the display apparatus can accordingly further comprise a control chip, which is electrically coupled to the image acquisition device and configured to receive and process the electrical signals outputted from the image acquisition device.

Herein optionally, the display apparatus can further include a circuit board, and the control chip is electrically coupled to the image acquisition device via the circuit board.

The circuit board can be further electrically connected to a circuit in the display panel, and the control chip can be further configured to control a display function of the display panel.

Herein, the circuit board can be a flexible circuit board.

In a second aspect, the disclosure further provides a method for manufacturing a display apparatus. The method comprises:

providing a display panel, wherein the display panel is provided with an image acquisition region within a display area thereof and comprises a substrate and a plurality of light-emitting elements over the substrate, wherein the plurality of light-emitting elements comprises one or more first light-emitting elements positionally within the image acquisition region, wherein each of at least one of the one or more first light-emitting elements comprises a non-transparent electrode provided with at least one through-hole configured to allow lights from an outside pattern to pass through the display panel; and disposing an image acquisition device over a side of the display panel opposing to a display surface thereof and at a position corresponding to the image acquisition region.

Other embodiments may become apparent in view of the following descriptions and the attached drawings.

BRIEF DESCRIPTION OF THE DRAWINGS

To more clearly illustrate some of the embodiments, the following is a brief description of the drawings. The drawings in the following descriptions are only illustrative of some embodiments. For those of ordinary skill in the art, other drawings of other embodiments can become apparent based on these drawings.

DETAILED DESCRIPTION

In the following, with reference to the drawings of various embodiments disclosed herein, the technical solutions of the embodiments of the disclosure will be described in a clear and fully understandable way. It is obvious that the described embodiments are merely a portion but not all of the embodiments of the disclosure. Based on the described embodiments of the disclosure, those ordinarily skilled in the art can obtain other embodiment(s), which come(s) within the scope sought for protection by the disclosure.

In a first aspect, the present disclosure provides a display apparatus.

The display apparatus includes a display panel and an image acquisition device over a side of the display panel opposing to a display surface. The display panel is provided with an image acquisition region within a display area thereof. The image acquisition device is at a position corresponding to the image acquisition region, and is configured to capture an image based on lights from an outside pattern over a side of the display panel proximal to the display surface.

The display panel comprises a substrate and a plurality of light-emitting elements over the substrate, wherein the plurality of light-emitting elements comprises one or more first light-emitting elements positionally within the image acquisition region of the display panel. Each of at least one of the one or more first light-emitting elements comprises a non-transparent electrode, wherein the non-transparent electrode is provided with at least one through-hole therein, configured to allow the lights from the outside pattern to pass through the display panel.

Herein the non-transparent electrode is referred to as an electrode having a light-transmission rate of less than 10%. Preferably, the non-transparent electrode has a light-transmission rate of substantially 0%. Optionally, the non-transparent electrode can be a reflective electrode.

In the following, the display apparatus according to some embodiments of the disclosure is described as an illustrating example.

Figure 1A:
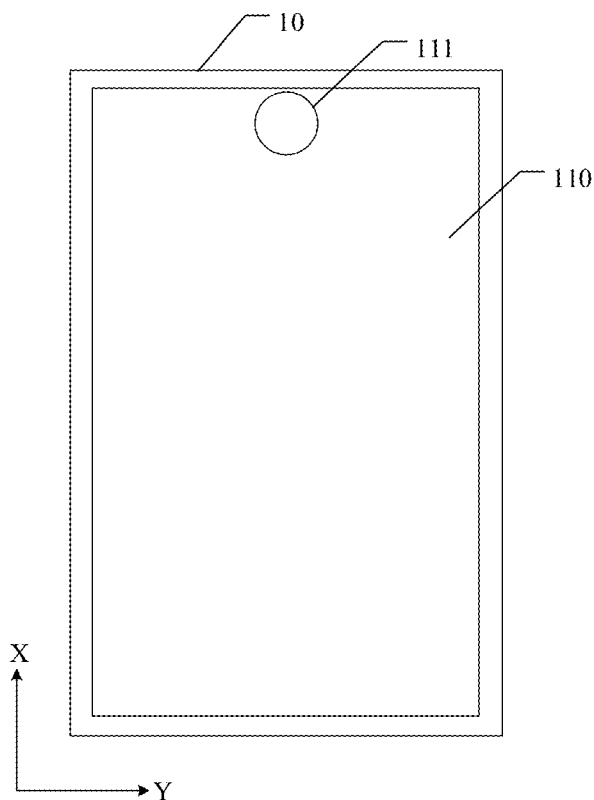
FIG. 1A is a top view illustrating the schematic diagram of the structure of a display apparatus according to some embodiments of the present disclosure.
Figure 1B:
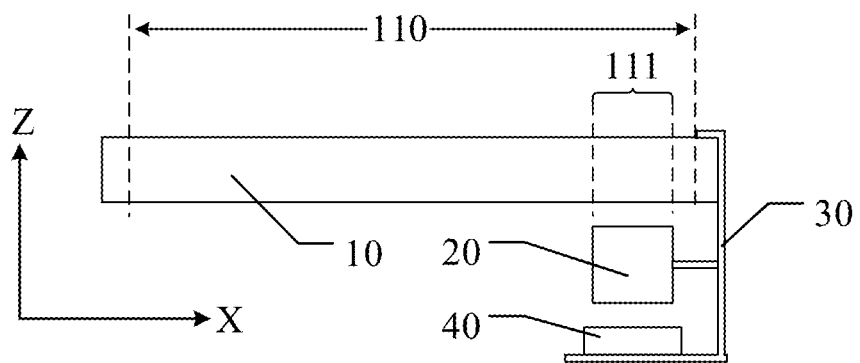
FIG. 1B is a side view of the structure of the display apparatus illustrated in FIG. 1A.
Figure 1C:
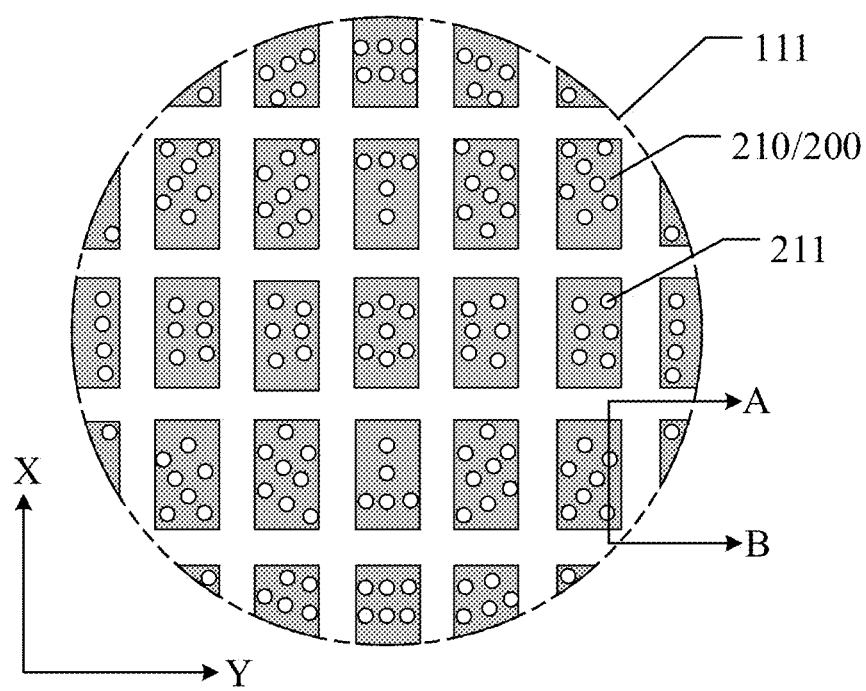
FIG. 1C is an enlarged planar view of the image acquisition region of the display apparatus illustrated in FIG. 1A.
Figure 2:
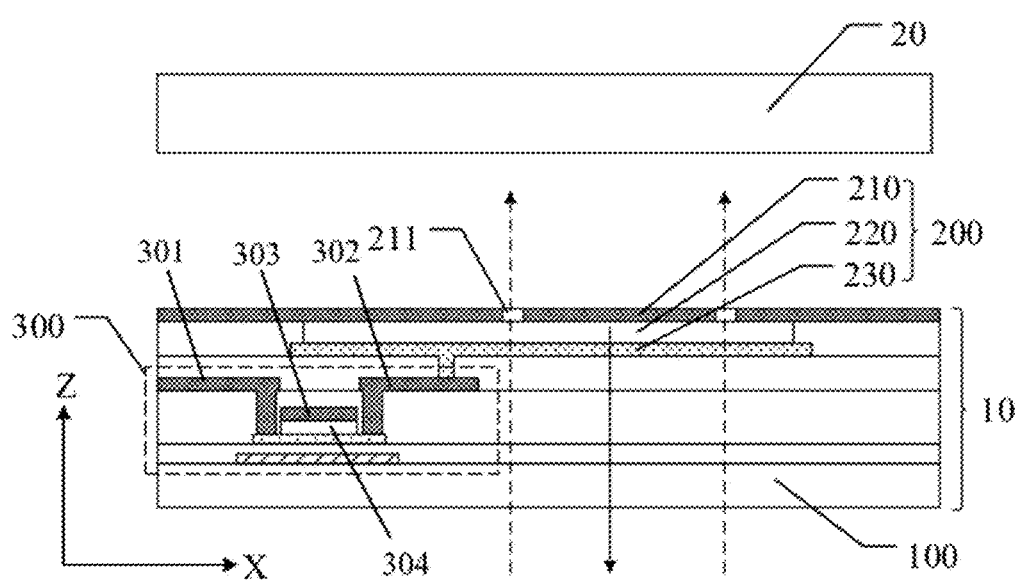
FIG. 2 is a cross-sectional view of the display apparatus illustrated in FIG. 1C along the A-B line according to some embodiments of the present disclosure.

FIG. 1A is a top view of the structure of a display apparatus according to some embodiments of the present disclosure. FIG. 1B is a side view of the structure of the display apparatus illustrated in FIG. 1A. FIG. 1C is a schematic diagram of the local enlargement plane of the image acquisition area of the display apparatus illustrated in FIG. 1A. FIG. 2 is a cross-sectional view of the display apparatus illustrated in FIG. 1C along the A-B line according to some embodiments of the present disclosure.

As illustrated in FIGS. 1A, 1B, 1C and 2, the embodiment of the display apparatus includes a display panel 10 and an image acquisition device 20.

The display panel 10 includes a substrate 100 and a plurality of organic light emitting elements 200. The substrate 100 includes a display area 110, and the display area 110 includes an image acquisition region 111. The plurality of organic light emitting elements 200 are arranged over the substrate 100 and within the display area 110. Each of the plurality of organic light emitting elements 200 includes a non-transparent electrode 210.

The image acquisition device 20 is within the image acquisition region 111, and is arranged over a surface of the display panel 10 opposing to a display surface of the display panel 10. In other words, in the cross-sectional view of the embodiment of the display apparatus illustrated in FIG. 2, the display surface is substantially the lower surface of the display panel 10, and the image acquisition device 20 is over an upper surface of the display panel 10.

In the image acquisition region 111, the non-transparent electrode 210 of at least one organic light emitting elements 200 is provided with at least one through-hole 211. The at least one through-hole 211 is configured to allow a light from an outside object (i.e. an object that is over a side of the display apparatus that is closer to the display surface of the display panel 10) to pass through the display panel 10 before entering into the image acquisition device 20, so that the image acquisition device 20 can capture the outside lights.

As such, at the same time of guaranteeing the camera function, the portion of the display panel 10 that overlaps with the image acquisition device 20 can also be provided with pixel units for display, because each pixel unit includes an organic light emitting element. Therefore, this overlapped portion can also be used for display, so that the display area of the display panel 10 is not affected by the setting of the image acquisition device 20.

For the above reasons, the display panel 10 of the display apparatus disclosed herein has a relatively larger display area and a better display effect than that of the existing display apparatus, which typically has the image acquisition device arranged within a slot/groove of the display panel.

It is noted that in the display apparatus disclosed herein, there is no limitation on the size and shape of each of the at least one through-hole 211 in the non-transparent electrode, as long as the image acquisition device 20 can capture the outside lights without affecting the light-emitting function of the plurality of organic light-emitting elements 200. In one illustrating example, each through-hole 211 can have a circular cross-sectional shape with a diameter of approximately 2-10 microns or micrometers. In other examples, the cross-section shape of each through-hole 211 can also be a square, a pentagon, another polygon, or irregular.

It is further noted that there is no limitation on the type of the image acquisition device 20. For example, the image acquisition device 20 can be a camera, or an optical sensor for fingerprint recognition, etc.

In at least one embodiment of the display apparatus, in the image acquisition region 111, outside lights enter into the image acquisition device 20 through the at least one through-hole 211 in the non-transparent electrode 210 to thereby pass through the display panel 10, and the lights reflected from the image acquisition device 20 are projected to various angles, and eventually the amount of lights emitted out from the at least one through-hole 211 are very small, and the intensity of the lights are also attenuated after reflection.

Moreover, when the pixel units in the image acquisition region 111 display images, because such emitted lights have a relatively strong intensity, it is difficult to observe the image acquisition device 20 from an outside and through the display panel 10. As such, the setting of the image acquisition device 20 does not have a negative impact on the visual effect of the images that are displayed.

It should be further noted that in this case, the intensity of the outside lights entering into the image acquisition device 20 is slightly lower than that of the structure such as direct acquisition of the external image without the at least one though-hole 211. As such, a signal amplification circuit can be configured in the display apparatus to amplify the signal that reflects the external image acquired by the image acquisition device 20 so as to obtain an enhanced image signal. Additionally, the enhanced image signal can also reduce the bad or negative influences of interference signals on the signal corresponding to the external image. These above advantages can together improve the clarity of the acquired external image.

In at least one embodiment of the display apparatus, the image acquisition device 20 includes an image sensor and a signal amplification circuit, which are electrically connected to each other. The image sensor is configured to convert optical signals corresponding to an external object into electrical signals, and the signal amplification circuit is configured to amplify the electrical signals.

According to some embodiments of the display apparatus, the image acquisition device 20 includes an optical component, an image sensor, and a circuit. The optical component includes a lens, which can include a plurality of lenses, an infrared filter, etc. The image sensor can be a CCD-type image sensor or a CMOS-type image sensor.

In one illustrating but non-limiting example, the lens collects lights from an external object (an external image) and supplies the lights to an image sensor, which is connected to the lens to convert the transmitted light signal (i.e. the optical signals) on the lens into electrical signals. Furthermore, a signal amplification circuit arranged in the image acquisition device 20, which is electrically connected with the image sensor, can amplify the electrical signals transmitted by the image sensor and then output the amplified electrical signals.

The optical signals can optionally comprise information of the lights (e.g. intensity) in a variety of colors (multiple bands) that together constitute an external image. For example, the optical signals can comprise signals corresponding to red light information, green light information, and blue light information, respectively.

In the process of converting the optical signals into the electric signals and amplifying the electric signals by the signal amplifying circuit, the electrical signals that respectively correspond to the red light, the green light and the blue light can be amplified proportionally so as to avoid the distortion of the acquired external image.

According to some embodiments of the display apparatus as illustrated in FIG. 1B, the display apparatus includes a flexible circuit board 30 and a control chip 40. The control chip 40 is electrically connected with the circuit in the display panel 10 through the flexible circuit board 30, and is configured to control the display function of the display panel 10.

In one illustrating example, a signal output terminal of the image acquisition device 20 (such as a signal output terminal of the signal amplification circuit) can be electrically connected to the flexible circuit board 30, so that the control chip 40 can process the electrical signals corresponding to the external image that are outputted from the image acquisition device 20.

Optionally, the control chip 40 can comprise a hardware circuit to realize corresponding functions. The hardware circuit can include a conventional VLSI circuit, a gate array, logic chips, transistors, or other semiconductor components or other discrete components. The control chip 40 can also be implemented by programmable hardware devices, such as field programmable gate array, programmable array logic, programmable logic device, and so on. There are no limitations herein.

There is no limitation on the type of image acquisition device 20. For example, in some embodiments of the present disclosure, there is one image acquisition device 20, and the one image acquisition device 20 is configured to receive and process lights passing through the entire image acquisition region.

According to some other embodiments of the present disclosure, the image acquisition device comprises a plurality of image acquisition units, which can have a one-to-one correspondence relationship with the plurality of organic light-emitting elements 200, so as to receive external lights passing through the at least one through-hole of the corresponding organic light emitting element.

There is also no limitation on the arrangement of the through-holes 211 in each of the non-transparent electrode 210. For example, according to some embodiments, the non-transparent electrode 210 in the image acquisition region 111 includes a plurality of through-holes 211, and the plurality of through-holes 211 in the non-transparent electrode 210 are uniformly arranged in an inside-to-outside direction based on the shape center of the image acquisition region 111.

In one example, the shape of the image acquisition region 111 is circular. As such, the external light distribution through the display panel can be uniform, and the image definition of the external image obtained by the image acquisition device 20 can be improved.

According to some embodiments of the display apparatus, each organic light-emitting element include a non-transparent electrode, an organic light-emitting functional layer, and a first electrode. One of the non-transparent electrode and the first electrode can be configured as an anode of the organic light-emitting element, and the other of the non-transparent electrode and the first electrode can be configured as a cathode of the organic light-emitting element.

Optionally, the first electrode is a transparent electrode or a translucent electrode. Herein, a transparent electrode is referred to as an electrode having about 75%-100% of the transmittance of lights, and a translucent electrode is referred to as an electrode having about 25%-75% of the transmittance of light.

Herein, the anode of the organic light-emitting element is substantially a layer that is electrically connected to a positive voltage of the display apparatus, and is configured to have a relatively better conductivity and a relatively higher work function value. According to some embodiments of the display apparatus, the anode layer comprises an inorganic metal oxide having a high work function, such as indium tin oxide (ITO), zinc oxide (ZnO), etc., or an organic conductive polymer having a high power function.

Herein, the cathode of the organic light-emitting element is substantially a layer that is electrically connected to a negative voltage of the display apparatus, and is configured to have a relatively better conductivity and a relatively lower work function value. According to some embodiments of the display apparatus, the cathode comprises a metal having a low work function, such as lithium, magnesium, calcium, strontium, aluminum, indium, etc., or an alloy comprising the above mentioned metal and at least one of copper, gold, or silver.

The organic light-emitting functional layer can include an electron injection sub-layer, an electron transport sub-layer, a light-emitting sub-layer, a hole transport sub-layer, and a hole injection sub-layer, which are arranged in stacks. In addition, a hole barrier sub-layer, or an electronic barrier sub-layer can be further arranged between the electronic transmission sub-layer and the light emitting sub-layer, and an electronic barrier sub-layer can be further arranged between the hole transmission sub-layer and the light emitting sub-layer. There are no limitations herein.

In the display apparatus described above, the image acquisition device is arranged over a surface of the display panel opposing to the display surface (i.e. display side) of the display panel. Herein, the display side of the display panel is related to the type of the plurality of organic light-emitting elements in the display panel.

According to some embodiments of the disclosure, the display surface of the display panel is on a side of the substrate that is opposing to (i.e. distal to) the plurality of organic light-emitting elements, and as such, the image acquisition device is over a side of the non-transparent electrode that is opposing to (i.e. distal to) the substrate, as illustrated in FIG. 2.

According to some other embodiments of the present disclosure, the display surface of the display panel is over a side of the plurality of organic light-emitting elements that is opposing to (i.e. distal to) the substrate, and as such, the image acquisition device is over a side of the substrate that is opposing to (i.e. distal to) the non-transparent electrode.

In the following, several structures of the plurality of organic light-emitting elements and the corresponding relative position of the image acquisition device in the display panel according to some embodiments of the display apparatus are described in detail.

According to some embodiments, each of the plurality of organic light-emitting elements has a bottom-emitting type, and the image acquisition device is over a side of the non-transparent electrode that is opposing to the substrate. As such, the organic light-emitting functional layer and the first electrode in each of the plurality of organic light-emitting elements are arranged between the non-transparent electrode and the substrate, and the first electrode is between the substrate and the organic light-emitting functional layer.

FIG. 2 illustrates one such embodiment of the display apparatus described above. In the organic light-emitting element 200 shown in FIG. 2, the first electrode 230, the organic light-emitting functional layer 220 and the non-transparent electrode 210 are sequentially stacked over the substrate 100. As such, the light emitted by and from the organic light-emitting functional layer 220 is reflected by the non-transparent electrode 210 to thereby emit out through the first electrode 230. That is, the display surface of the display panel is on a side of the substrate that is opposing to (i.e. distal to) the plurality of organic light-emitting elements 200.

Thereby, the plurality of organic light-emitting elements 200 are arranged between the substrate 100 and the image acquisition device 20. Thus, the image acquisition device 20 does not obstruct the light emitted by each of the plurality of organic light-emitting elements 200, and the image acquisition device 20 can receive the ambient light through the at least one through-hole 211 in the non-transparent electrode 210. Herein, the first electrode 230 can be a transparent electrode.

Further as illustrated in FIG. 2, a thin film transistor 300 can be arranged over the substrate 100. One of a drain electrode 301 or a source electrode 302 of the thin film transistor 300 can be electrically connected with the first electrode 230 (e.g. in the embodiment shown in FIG. 2, the source electrode 302 of the thin film transistor 300 is electrically connected with the first electrode 230), so that the switch-on or switch-off of the organic light-emitting element 200, as well as the light-emitting state thereof in the ON state, can be controlled by the thin film transistor 300.

There is no limitation to the type of the thin film transistor, which can be a bottom-gate type, a top-gate type, a double gate type, or other types of thin film transistor. It should be noted that in the embodiment where the thin film transistor 300 is a top-gate thin film transistor as shown in FIG. 2, the gate electrode 303 in the thin film transistor 300 can shield the light emitted by the organic light emitting element 200, which can thus protect the active layer 304 in the thin film transistor 300 without the need to arrange an additional shielding layer. As such, the manufacturing process of the display apparatus is simplified and the manufacturing cost is further reduced.

In the embodiment shown in FIG. 2, the first electrode 230 is the anode of the organic light-emitting element 200, and the non-transparent electrode 210 is the cathode of the organic light-emitting element 200. The material of the anode can comprise ITO and so on, which has a high light transmittance. As such, the light emitted by the organic light emitting element 200 has a high utilization rate, which results in a relatively low power consumption for the display apparatus, and a relatively high brightness of the images that are displayed by the display apparatus.

According to some embodiments of the disclosure, a plurality of non-electrodes in multiple organic light-emitting elements can be configured to be integrated with one another. That is, the plurality of non-transparent electrodes can be configured as a common electrode for the multiple organic light-emitting elements.

As an illustrating example shown in FIG. 2, the non-transparent electrode 210 is a common cathode for multiple organic light-emitting elements 200, with the first electrode 230 of different organic light-emitting elements 200 spaced apart from each other. As such, when the through-holes 211 are formed in the non-transparent electrode 210, through-holes 211 with a relatively uniform distribution can be formed in the non-transparent electrode 210 within the image acquisition region 111, and the through-holes 211 are also uniformly distributed in multiple organic light emitting elements 200 of the image acquisition region 111. As such, the manufacturing process of the through-holes 211 can be further simplified and the manufacturing cost can be further reduced without considering the specific location of each organic light emitting element 200.

Figure 3:
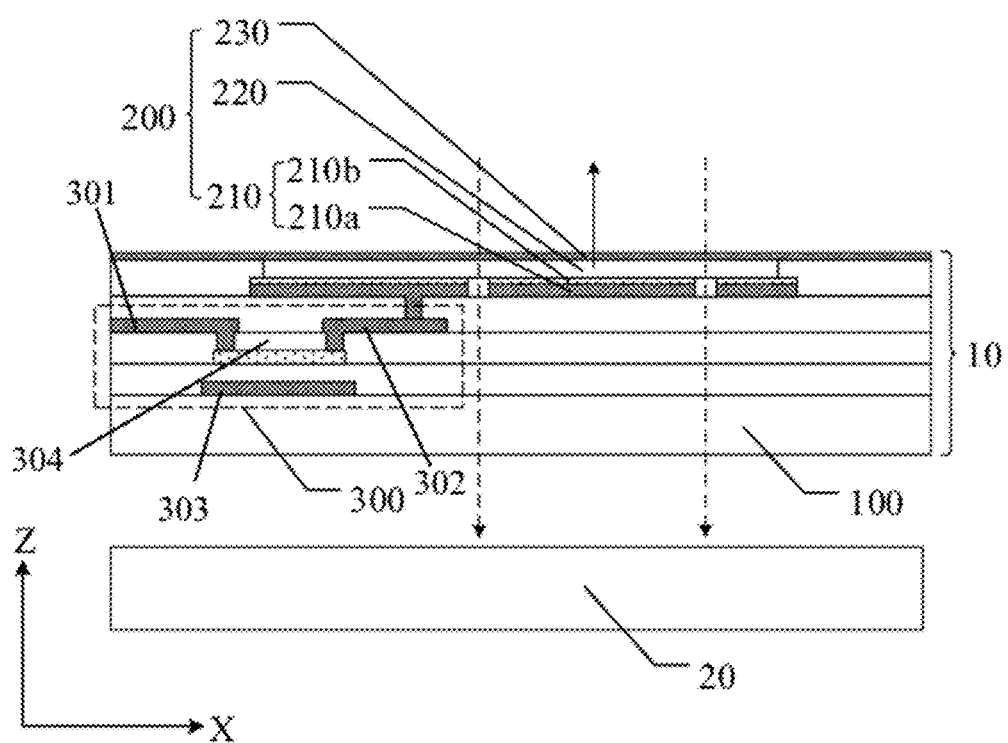
FIG. 3 is a cross-sectional view of the display apparatus illustrated in FIG. 1C along the A-B line according to some other embodiments of the present disclosure.

FIG. 3 is a cross-sectional view of the display apparatus illustrated in FIG. 1C along the A-B line according to some other embodiments of the present disclosure.

Herein in the embodiment of the display apparatus shown in FIG. 3, each of the plurality of organic light-emitting elements has a top-emitting type (as illustrated by the upward arrow in the figure), and the image acquisition device is over a side of the substrate that is opposing to (i.e. distal to) the non-transparent electrode. As such, the organic light-emitting functional layer and the first electrode of the organic light-emitting element are over a side of the non-transparent electrode that is opposing to the substrate, and the non-transparent electrode is between the substrate and the organic light-emitting functional layer.

FIG. 3 illustrates one such embodiment of the display apparatus described above. In the organic light-emitting element 200 shown in FIG. 3, the non-transparent electrode 210, the organic light-emitting functional layer 220 and the first electrode 230 are sequentially stacked over the substrate 100. As such, the light emitted by and from the organic light-emitting functional layer 220 is reflected by the non-transparent electrode 210 to thereby emit out through the first electrode 230. That is, the display surface of the display panel is on a side of the plurality of organic light-emitting elements 200 that is opposing to (i.e. distal to) the substrate 100.

Thereby, the substrate 100 is arranged between the plurality of organic light-emitting elements 200 and the image acquisition device 20. Thus, the image acquisition device 20 does not obstruct the light emitted by each of the plurality of organic light-emitting elements 200, and the image acquisition device 20 can receive the ambient light through the at least one through-hole 211 in the non-transparent electrode 210. Herein, the first electrode 230 can be a transparent electrode or a translucent electrode.

Similar to the embodiment illustrated in FIG. 2, in the embodiment shown in FIG. 3, a thin film transistor 300 can also be arranged over the substrate 100. One of a drain electrode 301 or a source electrode 302 of the thin film transistor 300 can be electrically connected with the non-transparent electrode 210 (e.g. in the embodiment shown in FIG. 3, the source electrode 302 of the thin film transistor 300 is electrically connected with the non-transparent electrode 210), so that the switch-on or switch-off of the organic light-emitting element 200, as well as the light-emitting state thereof in the ON state, can be controlled by the thin film transistor 300.

There is no limitation to the type of the thin film transistor, which can be a bottom-gate type, a top-gate type, a double gate type, or other types of thin film transistor. It should be noted that in the embodiment shown in FIG. 3, the light emitted by the organic light emitting element 200 is not blocked or shielded by the thin film transistor 300. As such, compared with the embodiment of the display apparatus shown in FIG. 2, the embodiment of the display apparatus shown in FIG. 3 has a relatively higher aperture ratio for the portion of the display panel (i.e. sub-pixel) corresponding to each organic light-emitting element 200 in the display panel, thus having an improved display effect.

Herein, as shown in FIG. 3, the first electrode 230 can be an anode of the organic light emitting element 200, and the non-transparent electrode 210 can be the cathode of the organic light emitting element 200.

Optionally, the non-transparent electrode 210 includes a first electrode sub-layer 210a and a second electrode sub-layer 210b. The first electrode sub-layer 210a is between the second electrode sub-layer 210b and the substrate 100, and the second electrode sub-layer 210b is configured to be a reflection electrode (at least on a surface facing the first electrode 230, i.e. the top surface thereof in FIG. 3). According to some the material of the second electrode sub-layer 210b can be copper, aluminum, silver, or other metals, and the material of the first electrode sub-layer 210b can be ITO, or another electrode material with a high work function value.

The first electrode sub-layer 210a and the second electrode sub-layer 210b can be formed in a same composition process (e.g. lithography process), and the through-holes 211 can be synchronously formed in the composition process. As such, the manufacturing process of the non-transparent electrode 210 is simplified and the manufacturing cost of the display apparatus is reduced.

Optionally, the structural layers of multiple organic light emitting elements 200 can be shared to thereby simplify the manufacturing process of the display apparatus.

In some embodiments of the present disclosure, multiple non-transparent electrodes in multiple organic light-emitting elements may be configured to be spaced apart from one another. As an example, as shown in FIG. 3, the non-transparent electrode 210 is the anode of the organic light emitting element 200, and the non-transparent electrodes 210 of multiple organic light emitting elements 200 are spaced apart from one another.

As such, when a patterning process is performed over a material layer to form a plurality of non-transparent electrodes 210 spaced between each other, the through-holes 211 can be formed in the non-transparent electrodes 210 within the image acquisition region 111 at the same time. The through-holes 211 thus formed are uniformly distributed in the multiple organic light emitting elements 200 in the image acquisition region 111. Thereby, the manufacturing process can be simplified, and the manufacturing cost of the display apparatus can be reduced.

In some embodiments of the disclosure, such as those illustrated in FIGS. 2 and 3, the organic light-emitting functional layer 220 in each organic light-emitting element 200 is arranged separately, such that the organic light-emitting functional layer 220 in different organic light-emitting elements 200 are spaced apart from one another.

According to some embodiments of the display apparatus, the organic light-emitting functional layer 220 in each organic light-emitting element 200 is configured to emit a red light, a green light, a blue light, respectively.

According to some other embodiments of the display apparatus, multiple organic light emitting elements are configured to share a same organic light emitting functional layer, configured to emit a white light, or a blue light, etc.

In a second aspect, the present disclosure further provides a method for manufacturing a display apparatus according to any one of the embodiments described above.

The display apparatus includes a display panel and an image acquisition device, and the manufacturing method comprises the following steps:

S100: providing a substrate, wherein the substrate includes a display area, and the display area further includes an image acquisition region;

S200: forming a plurality of organic light emitting elements over the substrate, wherein each of the plurality of organic light emitting elements 200 within the image acquisition region includes a non-transparent electrode, which is provided with at least one through-hole therein; and S300: disposing an image acquisition device within the image acquisition region and over a surface of the display panel opposing to a display surface of the display panel.

Herein, the at least one through-hole is provided in the non-transparent electrode in each organic light emitting element and at positions corresponding to the image acquisition region, which is configured to allow a light from an outside object to pass therethrough before entering into the image acquisition device.

In the display apparatus manufactured by the above-mentioned manufacturing method, the portion of the display panel corresponding to the image acquisition region can still display images. That is, the installation of the image acquisition device does not reduce the display area of the display panel.

Moreover, lights in the external environment can enter the image acquisition device through the at least one through-hole in the non-transparent electrode, thereby the display apparatus can realize the function of acquiring external images without cutting or digging the display panel, which reduces the difficulty of the manufacturing process of the display apparatus and additionally reduces the manufacturing cost.

According to some embodiments of the display apparatus, the image acquisition device is arranged over a side of the non-transparent electrode that is opposing to the substrate, as illustrated in FIG. 2. As such, in the manufacturing method, the step S200 of forming a plurality of organic light emitting elements over the substrate comprises the following sub-steps:

S210: sequentially forming a first electrode and an organic light-emitting functional layer over the substrate, wherein the first electrode is transparent; and S220: forming a non-transparent electrode over the organic light-emitting functional layer, wherein the non-transparent electrode has at least one through-hole therein.

According to some other embodiments of the display apparatus, the image acquisition device is arranged over a side of the substrate that is opposing to the non-transparent electrode, as illustrated in FIG. 3. As such, in the manufacturing method, the step S200 of forming a plurality of organic light emitting elements over the substrate comprises the following sub-steps:

S210': forming a non-transparent electrode over the substrate, wherein the non-transparent electrode has at least one through-hole therein; and S220': sequentially forming an organic light-emitting functional layer and a first electrode over the non-transparent electrode, wherein the first electrode is transparent or translucent.

According to some embodiments, the sub-step S220 of forming a non-transparent electrode comprises:

S221: depositing a conductive material film over the organic light-emitting functional layer to thereby form the non-transparent electrode; and S222: performing a patterning process on the non-transparent electrode to thereby form the at least one through-hole in the non-transparent electrode at positions corresponding to the image acquisition region.

Optionally, the non-transparent electrode is a common electrode of multiple organic light-emitting elements.

According to some embodiments, the sub-step S210' of forming a non-transparent electrode comprises:

S211': depositing a conductive material film over the organic light-emitting functional layer;

S212': performing a patterning process on the conductive material film to form a plurality of non-transparent electrodes, wherein the plurality of non-transparent electrodes are spaced apart from one another, and the non-transparent electrode at positions corresponding to the image acquisition region is provided with at least one through-hole.

In a third aspect, the present disclosure further provides a method for operating a display apparatus according to any one of the embodiments described above.

The operating method comprises:

S910: controlling the image acquisition device to be in a working state and the plurality of organic light-emitting elements in the image acquisition region not to emit lights; and S920: controlling the image acquisition device to be in a non-working state and the plurality of organic light-emitting elements in the image acquisition region to emit lights.

In one illustrating example of the method for operating the display apparatus illustrated in FIG. 2, when the image acquisition device 20 is in a working state to capture an external image, the plurality of organic light-emitting elements 200 in the image acquisition region 111 do not emit lights, and therefore, thereby the interference of the lights emitted by the organic light-emitting elements 200 on the image acquisition device 20 can be avoided, and the clarity of the acquired external image can be improved.

On the other hand, when the image acquisition device 20 is in a non-working state, the organic light-emitting elements 200 in the image acquisition region 111 can work normally to emit lights, and as such the portion of the display panel 10 corresponding to the image acquisition region 111 can still display images.

All references cited in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A display apparatus, comprising: a display panel, provided with an image acquisition region within a display area thereof; and an image acquisition device over a side of the display panel opposing to a display surface thereof and at a position corresponding to the image acquisition region, configured to capture an image based on lights from an outside pattern over a side of the display panel proximal to the display surface; wherein: the display panel comprises a substrate and a plurality of light-emitting elements over the substrate, wherein the plurality of light-emitting elements comprises one or more first light-emitting elements positionally within the image acquisition region of the display panel, wherein: each of at least one of the one or more first light-emitting elements comprises a non-transparent electrode, wherein the non-transparent electrode is provided with a plurality of through-holes therein, wherein through-holes of the one or more first light-emitting elements are distributed substantially uniformly in an inside-to-outside direction based on a center of the image acquisition region, and are configured to allow the lights from the outside pattern to pass through the display panel; the display apparatus further comprising an amplification circuit configured to amplify a signal that reflects the image so as to obtain an enhanced image signal while reducing negative influences of interference signals.

2. The display apparatus of claim 1, wherein the image acquisition device is disposed over a side of the non-transparent electrode opposing to the substrate, wherein each of the one or more first light-emitting elements further comprises an organic light-emitting functional layer and a first electrode, wherein: the first electrode is substantially transparent; the organic light-emitting functional layer is between the first electrode and the non-transparent electrode; and the first electrode is between the substrate and organic light-emitting functional layer.

3. The display apparatus of claim 2, wherein each of the one or more first light-emitting elements further comprises a thin film transistor over the substrate, wherein:
one of a drain electrode or a source electrode of the thin film transistor is electrically connected with the first electrode such that the thin film transistor can control a light-emitting state of the each of the one or more first light-emitting elements.

4. The display apparatus of claim 3, wherein the thin film transistor comprises a gate electrode and an active layer, wherein:
the gate electrode is non-light-transmitting and is between the active layer and the organic light-emitting functional layer.

5. The display apparatus of claim 1, wherein the image acquisition device is over a side of the substrate opposing to the non-transparent electrode.

6. The display apparatus of claim 5, wherein each of the one or more first light-emitting elements further comprises an organic light-emitting functional layer and a first electrode, wherein:
the first electrode is substantially transparent;
the organic light-emitting functional layer is between the first electrode and the non-transparent electrode; and
the non-transparent electrode is between the organic light-emitting functional layer and the substrate.

7. The display apparatus of claim 6, wherein the non-transparent electrode is configured to have a reflecting surface facing the organic light-emitting functional layer.

8. The display apparatus of claim 6, wherein the non-transparent electrode comprises a first electrode sub-layer and a second electrode sub-layer, wherein:
the first electrode sub-layer is between the second electrode sub-layer and the substrate; and
the second electrode sub-layer has a reflective surface facing the organic light-emitting functional layer.

9. The display apparatus of claim 8, wherein the first electrode sub-layer comprises an electrode material with a high work function value.

10. The display apparatus of claim 1, wherein a number of the at least one of the one or more first light-emitting elements is more than one, wherein:
the non-transparent electrode in each of the at least one of the one or more first light-emitting elements is integrated with one another.

11. The display apparatus of claim 1, wherein a number of the at least one of the one or more first light-emitting elements is more than one, wherein:
the non-transparent electrode in each of the at least one of the one or more first light-emitting elements is spaced apart from one another.

12. The display apparatus of claim 1, wherein a cross-sectional shape of each of the at least one through-hole is a circle, a square, a polygon, or an irregular shape.

13. The display apparatus of claim 12, wherein the cross-sectional shape is a circle with a diameter of approximately 2-10 microns.

14. The display apparatus of claim 1, wherein:
the image acquisition device is configured to convert optical signals derived from the lights from the outside pattern into electrical signals; and
the display apparatus further comprises a control chip, electrically coupled to the image acquisition device and configured to receive and process the electrical signals outputted from the image acquisition device.

15. The display apparatus of claim 14, further comprising a circuit board, wherein the control chip is electrically coupled to the image acquisition device via the circuit board.

16. The display apparatus of claim 15, wherein:
the circuit board is further electrically connected to a circuit in the display panel; and
the control chip is further configured to control a display function of the display panel.

17. The display apparatus of claim 15, wherein the circuit board is a flexible circuit board.

18. A method for manufacturing a display apparatus, comprising:
providing a display panel, wherein the display panel is provided with an image acquisition region within a display area thereof and comprises a substrate and a plurality of light-emitting elements over the substrate, wherein the plurality of light-emitting elements comprises one or more first light-emitting elements positionally within the image acquisition region, wherein each of at least one of the one or more first light-emitting elements comprises a non-transparent electrode provided with a plurality of through-holes therein, wherein through-holes of the one or more first light-emitting elements are distributed substantially uniformly in an inside-to-outside direction based on a center of the image acquisition region, and are configured to allow lights from an outside pattern to pass through the display panel;

disposing an image acquisition device over a side of the display panel opposing to a display surface thereof and at a position corresponding to the image acquisition region; and providing an amplification circuit configured to amplify a signal that reflects the image so as to obtain an enhanced image signal while reducing negative influences of interference signals, wherein the image acquisition device is disposed over a side of the non-transparent electrode opposing to the substrate.

* * * * *